United States Patent [19]

Crafts

[11] Patent Number: 5,045,728
[45] Date of Patent: Sep. 3, 1991

[54] TRINARY TO BINARY LEVEL CONVERSION CIRCUIT

[75] Inventor: Harold S. Crafts, Fort Collins, Colo.

[73] Assignee: NCR Corporation, Dayton, Ohio

[21] Appl. No.: 683,581

[22] Filed: Apr. 10, 1991

Related U.S. Application Data

[63] Continuation of Ser. No. 353,284, May 17, 1989, abandoned.

[51] Int. Cl.[5] .................... H03K 17/30; H03K 17/693
[52] U.S. Cl. .................................... 307/475; 307/443; 307/451; 307/473; 307/261; 341/57
[58] Field of Search ............... 307/443, 450, 473, 475, 307/451, 261, 263; 341/56, 57

[56] References Cited

U.S. PATENT DOCUMENTS

| | | | |
|---|---|---|---|
| 4,302,690 | 11/1981 | Gollinger et al. | 307/473 |
| 4,682,047 | 7/1987 | von Sichart | 307/473 |
| 4,682,052 | 7/1987 | Kyomasu | 307/473 |
| 4,808,854 | 2/1989 | Reinagel | 307/473 |

FOREIGN PATENT DOCUMENTS

| | | | |
|---|---|---|---|
| 0121821 | 6/1985 | Japan | 307/473 |
| 0145932 | 7/1986 | Japan | 307/473 |

Primary Examiner—Timothy P. Callahan
Attorney, Agent, or Firm—Wilbert Hawk, Jr.; Stephen F. Jewett; James M. Stover

[57] ABSTRACT

An electronic circuit for converting trinary level input signals on a first line into binary level signals on two or more output lines using contemporary CMOS field effect transistor integrated circuits. According to one embodiment, conversion is accomplished using two CMOS inverters each asymmetrically configured to exhibit transconductances which differ by a factor in excess of 5. In another form, the circuit provides hysteresis through positive feedback to limit binary output state perturbations attributable to trinary signal level input noise. The invention also encompasses the use of decode logic and logically combined delay elements to eliminate "glitches" and facilitate selective enablement of the decoded states representing the intermediate of the trinary input levels.

7 Claims, 4 Drawing Sheets

TRINARY TO BINARY LEVEL CONVERSION CIRCUIT

This is a continuation of application Ser. No. 07/353,284, filed May 17, 1989, now abandoned.

BACKGROUND OF THE INVENTION

The present invention relates to an electronic circuit for communicating in trinary logic. More particularly, the invention involves, in its various facets, configurations of electronic devices suitable to receive a trinary level signal on a single input and provide a noise and transition "glitch" insensitive binary state output, or a fully decoded output on three lines.

The use of trinary logic for electronic circuits is relatively well-known. For example, U.S. Pat. Nos. 4,202,044 and 4,488,065 relate to the storage and retrieval of memory array data stored in trinary format. U.S Pat. No. 4,449,065 involves a circuit for converting a single trinary input signal into a pair of binary output signals using a clocked precharging. U.S. Pat. No. 3,832,576 introduces various circuit techniques for decoding a pair of binary outputs with logic gates. Although similar concepts exist in these representative prior teachings, the implementations are relatively constrained to particular circuit embodiments and provide no specific feedback compensation to offset for either input signal noise effects or slow input signal transition induced output state glitches.

SUMMARY OF THE INVENTION

The present invention has a number of features which facilitate the common use of trinary logic for contemporary electronic devices. The invention is particularly inclined to integrated circuit applications fabricated from complementary field effect transistors. In such integrated circuit applications, trinary logic is particularly useful for integrated circuit chips which are pad limited, in that the number of pads available is less than the number of input lines needed to operate the chip for both its routine and test modes of operation.

The present invention effectively extends the functionality of each input line or pad by permitting the trinary logic, with associated voltage levels of 0 volts, 2.5 volts, and 5 volts, to increase the information content transferrable through a single line or pad by a factor of 3:2. The present invention extends the fundamental concept to an efficient implementation in a contemporary CMOS field effect integrated circuit product. The invention also provides, in various forms of the circuit, noise suppression using feedback introduced hysteresis, and logic with delay to eliminate glitches in the binary output during slow transitions of the trinary input between voltage extremes.

The conversion from trinary logic to binary logic using contemporary CMOS integrated circuit field effect transistor devices is accomplished through a judicious selection of transconductance in each of the inverter configured pairs of complementary field effect transistors. The circuit receives a trinary input state as a voltage on one line and provides the equivalent binary state output voltages on a pair of lines.

As embodied, the transconductance ratio of p and n-channel transistors in the first complementary inverter is nominally 15:1. The second inverter exhibits a nominal ratio of 1:15. The transistor width and length dimensions take into account p-channel and n-channel transistor mobility characteristics. When the p-channel and n-channel transistors in such inverters exhibit nominal threshold voltages of −0.8 volts and +0.8 volts, respectively, such pair of inverters will serve to receive a trinary level signal on a single input line and provide the corresponding binary state values on two output lines.

Given that the voltage range assigned to a trinary mode state is significantly less than for binary state operation, uncompensated noise on the trinary input is more likely to produce erroneous outputs. One embodiment of the present invention provides a positive feedback with hysteresis to reduce noise sensitivity. The hysteresis is produced by shunting transistors enabled by the binary output state in each of the two trinary-to-binary inverter conversion paths.

Another facet of the invention includes circuit elements to eliminate "glitches" in the binary or decoded output stages. Glitches routinely occur during transitions of the trinary input, for example when the trinary input transitions through the intermediate 2.5 volt level during a switch from a 0 volt level to a 5 volts level. The invention provides decode logic which combines direct and delayed path signals to detect and ignore monetary occurrences of the midrange trinary level.

These and other unique features of the invention will be more clearly understood and more fully appreciated upon considering the detailed embodiments set forth hereinafter.

DETAILED DESCRIPTION OF THE DRAWINGS

DESCRIPTION OF THE PREFERRED EMBODIMENTS

The application of trinary logic to CMOS type field effect transistor integrated circuits is motivated in part by the increased functionality capable on an integrated circuit chip in relation to the number of access pins/pads available for conveying electrical signals to and from the integrated circuit chip. An additional, and a somewhat distinct motivation, is attributable to the accentuated reliability objectives being demanded by chip customers, requiring comprehensively testing of the numerous functions on an integrated chip without massively increasing the pins/pad count for the singular purpose of acceptance testing.

In the context of satisfying the latter objective, the present invention provides the capability to have test equipment introduce non-standard signal voltages to enable or control test functions. Thereby, the test signals share pin/pads with input-output lines having distinctly different operationally defined functions. It is in this context that the present invention finds particular great use and value. The invention provides the ability to receive trinary level test control signals and to fully decode such signals based upon the level of the trinary input and its duration.

Figure 1:
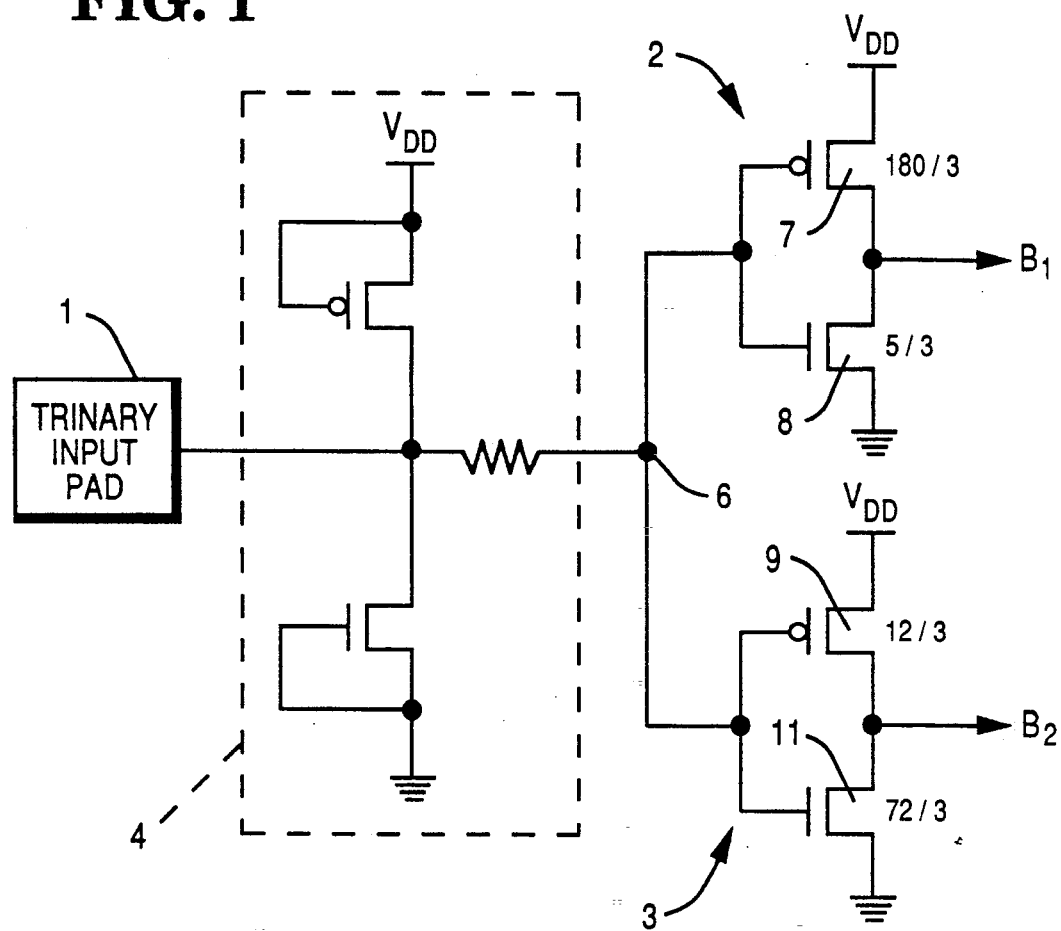
FIG. 1 is a schematic illustrating a trinary-to-binary converter circuit.

FIG. 1 illustrates one embodiment of the invention. The CMOS field effect transistor circuit converts trinary input data on a first line, input pad 1, into binary data on the pair of output lines $B_1$ and $B_2$, using a pair of CMOS inverters 2 and 3. The diode connected transistors and resistor within the dashed block 4 represent relatively conventional electrostatic discharge (ESD) protection devices connected to the input pads of integrated circuit chips.

What makes the present conversion circuit appealing is the efficacy with which trinary input data on node 6 of CMOS inverters 2 and 3 is converted into binary state output data on lines $B_1$ and $B_2$. When configured as shown in FIG. 1, having the width/length ratios specified therein for the p-channel and n-channel transistors 7, 8, 9 and 11, the ratio of transconductance is approximately 15:1 for one CMOS inverter and 1:15 for the other CMOS inverter. These dimensions take into account the relative differences in device mobility. The p-channel transistors are fabricated to have a −0.8 volt threshold and n-channel transistors exhibit a +0.8 volt threshold.

During operation of the circuit in FIG. 1, trinary input signals on node 6 in the range of the 0–1.25 volts cause both $B_1$ and $B_2$ to remain near $V_{DD}$, representing binary 1 values. With the trinary input signal on node 6 in the range of 1.25–3.75 volts, $B_1$ remains at the high, the binary 1 level, while $B_2$ is pulled low to the binary 0 level. The concluding trinary state input operating range requires that node 6 be between 3.75 volts and 5 volts ($V_{DD}$) This input causes both $B_1$ and $B_2$ to become binary 0 in value. A pair of CMOS inverters having complementary transconductance ratios thereby form the nucleus of a converter for receiving trinary state input signals on a single line and converting such into binary state output signals on two lines.

Reasonable care must be exercised in selecting the threshold voltages of the CMOS inverter field effect transistors in order to match the trinary input ranges with the transconductance ratios of the paired transistors. With the threshold of n-channel field effect transistor 11 at +0.8 volts, a trinary input at the low range of 0–1.25 volts does not enable transistor 11 sufficiently to offset the current furnished through fully enabled p-channel transistor 9. Thereby, line $B_2$ continues to be pulled to the level of $V_{DD}$. In the midrange of the trinary state input signal, when node 6 lies between 1.25 and 3.75 volts, and is nominally 2.5 volts, high transconductance n-channel transistor 11 is sufficiently enabled to pull node $B_2$ to ground notwithstanding the continued enablement of materially lower transconductance p-channel transistor 9. Given the relative size of p-channel field effect transistor 9 in relation to n-channel field effect transistor 11, the threshold voltage of transistor 9 is not critical. On the other hand, the opposite situation exists for p-channel transistor 7 of CMOS inverter 2. Preferably, the threshold of p-channel transistor 7 is in the range of −0.8 volts to ensure that output line $B_1$ is pulled to ground by relatively smaller transconductance n-channel transistor for input node 6 voltages in the range 3.75 to 5 volts ($V_{DD}$).

Figure 2:
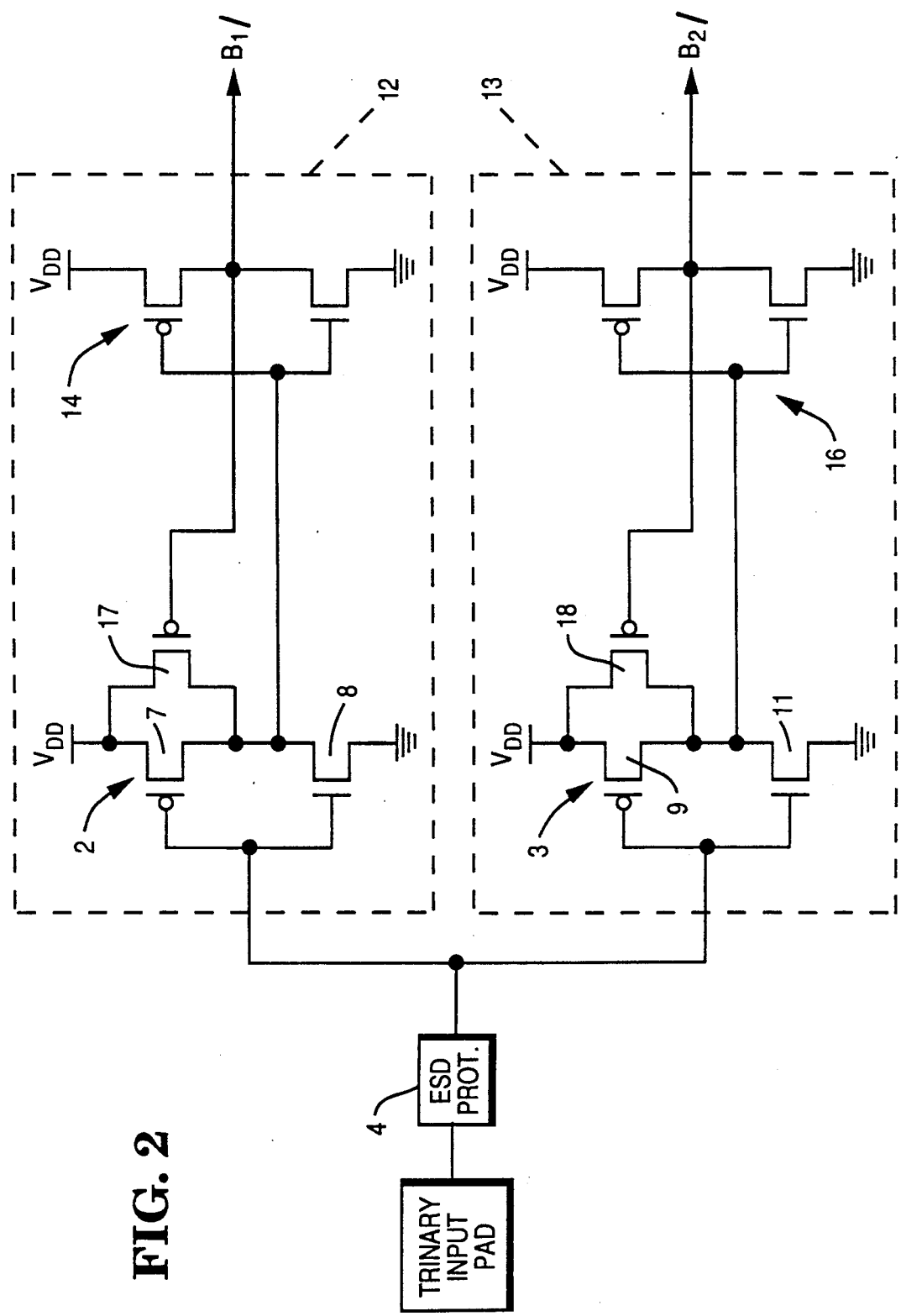
FIG. 2 is a schematic illustrating a trinary-to-binary converter circuit having hysteresis.

Referring now to FIG. 2, the binary levels $B_1$ and $B_2$ are made more distinctive and less susceptible to noise on the trinary input mode 6 by providing for each path a nominal increment of hysteresis through negative feedback from added conventional inverter stages 14 and 16, thereby providing biasing of the transconductance ratios associated with CMOS inverters 2 and 3.

Converter 12 is responsible for generating the binary output signal $B_{1/}$, while converter 13 is responsible for generating the binary output signal $B_{2/}$, which two signals are the complements of the aforementioned binary signals $B_1$ and $B_2$ as further refined by hysteresis effects. The additional CMOS inverters 14 and 16 also eliminate any offset voltages produced as a consequence of analog effects in inverters 2 and 3, in pursuit of ideal binary state output signals. Shunting p-channel field effect transistors 17 and 18 are enabled whenever $B_{1/}$ or $B_{2/}$, respectively, are pulled low. This action introduces shunting path hysteresis into the actions of inverters 2 and 3.

Nominally, p-channel transistor 17 is capable of conducting approximately 50% or less of the peak current through n-channel transistor 8, while p-channel transistor 18 is capable of conducting approximately 50% of the peak current through p-channel field 9. The hysteresis is thus preferably about 300 millivolts for a conventional noise voltage tolerance of +150 millivolts.

Figure 3:
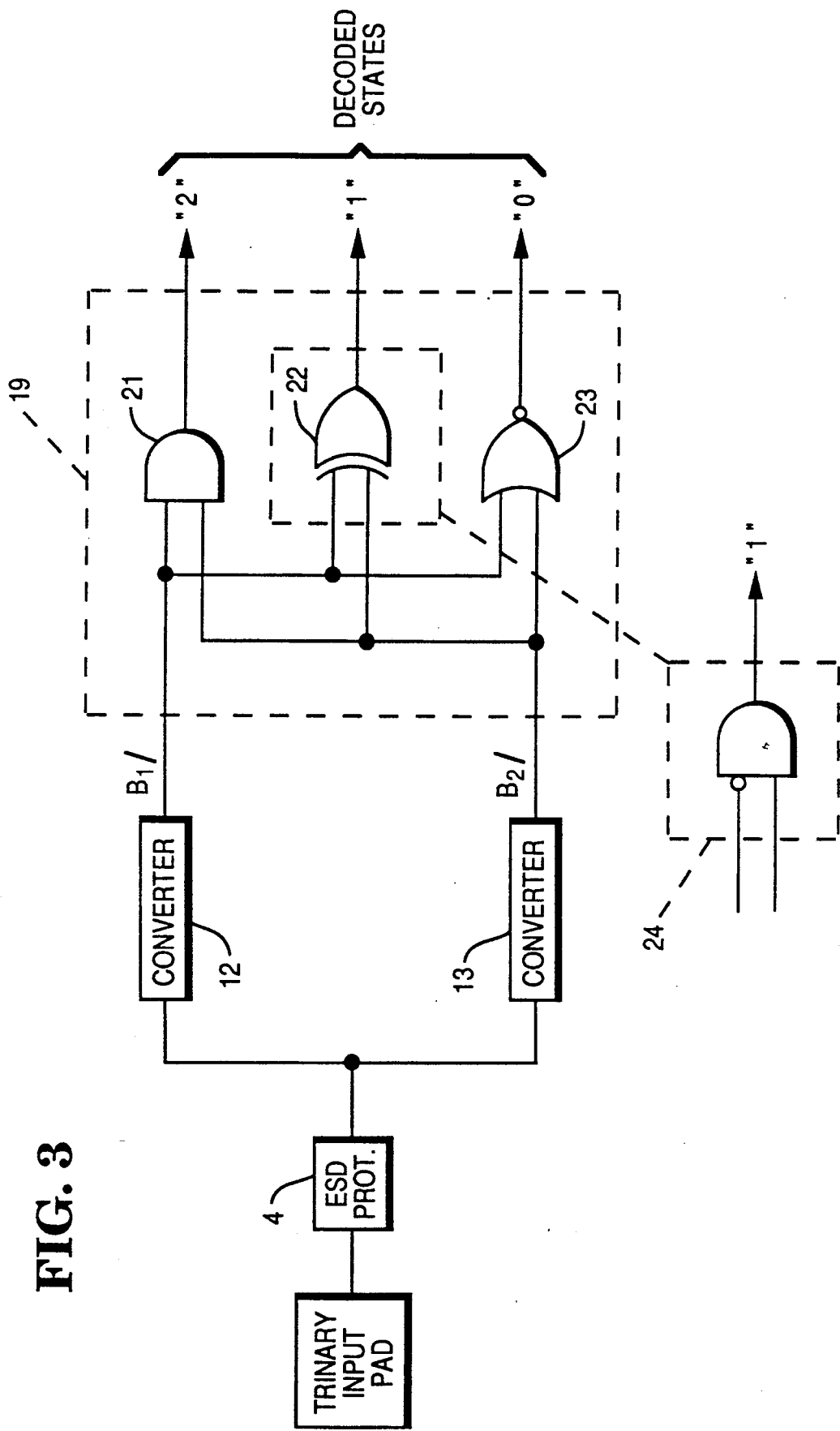
FIG. 3 is a schematic illustrating a circuit with logic suitable to decode converted binary states.

FIG. 3 illustrates a further varient of the invention, now including logic, within dashed block 19, to effectuate a full decode of the trinary input signal into responses on one of three output lines. The decoded output is generated by a set of logic elements, which logic elements include AND gate 21, XOR gate 22 and NOR gate 23. For the present application, XOR gate 22 could be replaced with the selectively configured AND gate, depicted generally as block 24. Operation of the decode on the binary values of lines $B_{1/}$ and $B_{2/}$ can be readily understood and related to the trinary state inputs by comparing the effects of trinary levels with the individual decoded output states.

Figure 4:
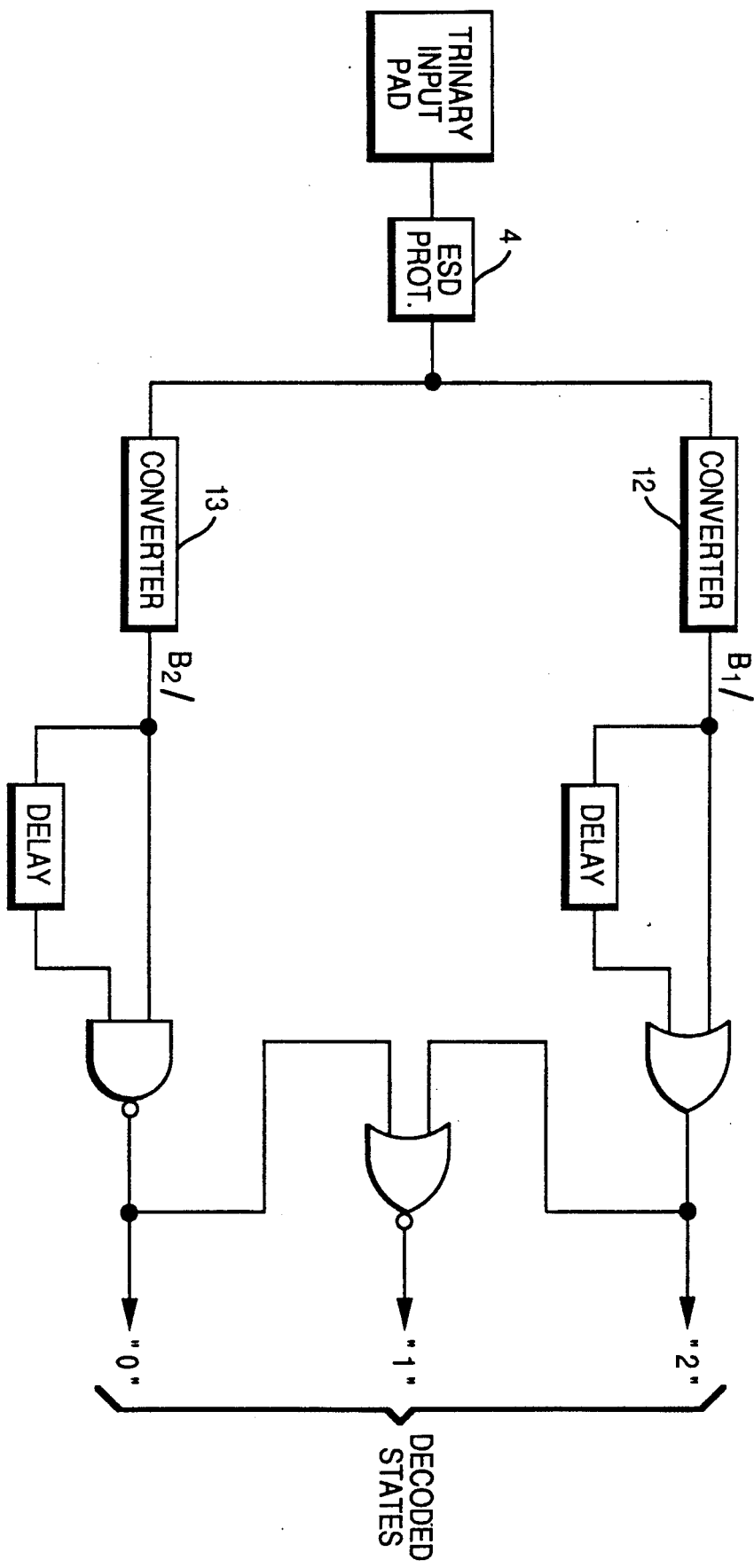
FIG. 4 is a schematic illustrating a circuit suitable to decode the binary states and eliminate glitches.

FIG. 4 illustrates an embodiment which provides the further refinement of "glitch" elimination, through the inclusion of delay paths within the decode logic. The delays ensure that the decoded states are not generated when the intermediate trinary input signal level is present for a period less than the interval of the delay. Such excursion could be attributable to noise effects or slow transitions of the trinary input signal through the intermediate level. The combination of delay and logic elements depicted in FIG. 4 ensures that such abnormal input conditions do not generate decoded output states.

Although the delay functions are shown integrated into the decode logic, it should be apparent that the invention fully contemplates any delay arrangement which defers the propagation of the binary state output sufficiently to allow resolution of the long term validity by comparisons between the delayed and the undelayed signals. One should also understand and appreciate that the delay function could be used to time-selectively enable test modes. The trinary input pad would be designed to operate with conventional binary level signals, namely 0 volt or 5 volts, specified to exhibit minimum transition rates. The test mode enabling delay would defer the onset of the "1" state, as generated in FIG. 4, well beyond any normal operating mode transistion time interval.

Figure 5:
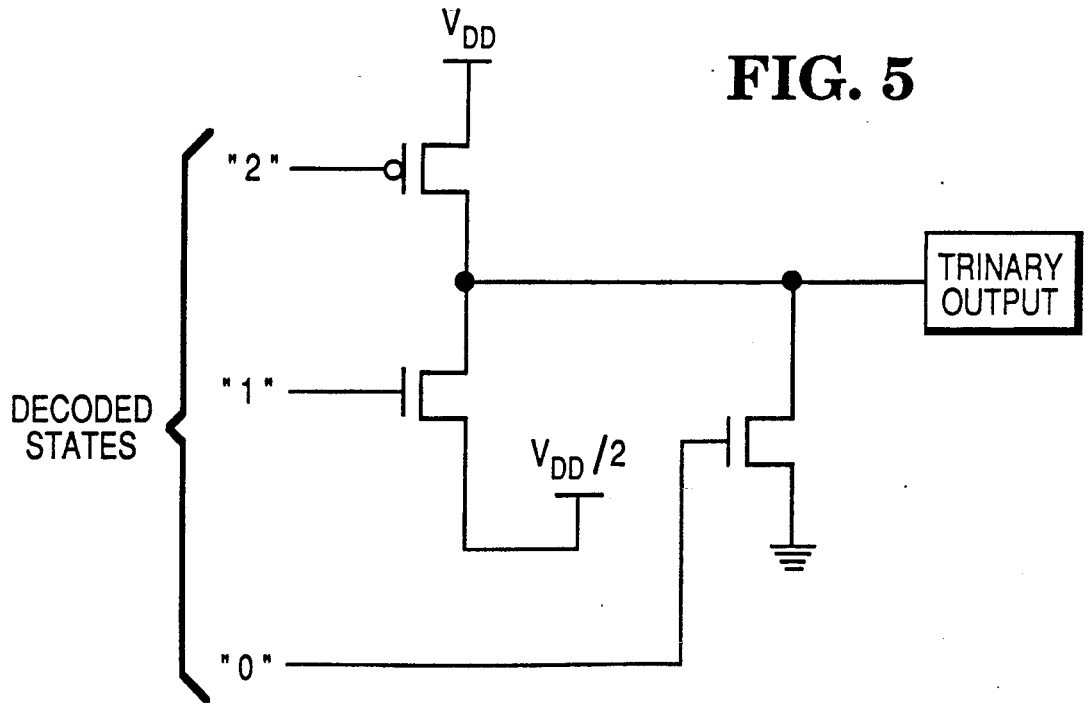
FIG. 5 illustrates a circuit suitable to generate a trinary output in response to decoded state information.

FIG. 5 illustrates that the reverse direction of conversion, from decoded to trinary states, can also be implemented using conventional field effect transistor devices.

Consequently, the present invention provides circuits for translating trinary, binary and decoded signals with minimum circuit complexity, and as such provides a practical solution to the common pad limitation problem for integrated circuit chips.

It will be understood by those skilled in the art that the embodiments set forth hereinbefore are merely exemplary of the various elements and usages essential to the present invention, and as such may be replaced by equivalents without departing from the invention thereof, which now will be defined by appended claims.

I claim:

1. An electronic circuit for converting trinary level input signals on a first line to binary level output signals on a second and a third line, comprising:
   a first CMOS field effect transistor inverter connected to receive said trinary level input signals from the first line and generate binary level output signals on the second line, characterized in that the transconductance of the p-channel pull-up field effect transistor exceeds the transconductance of the n-channel pull-down field effect transistor by a first factor nominally greater than 5;
   a second CMOS field effect transistor inverter connected to receive said trinary level input signals from the first line and generate binary level output signals on the third line, characterized in that the transconductance of the n-channel pull-down field effect transistor exceeds the transconductance of the p-channel pull-up field effect transistor by a second factor greater than 5;
   a first feedback circuit connected to receive the binary level output signals generated by said first CMOS inverter from said second line and connected to said first CMOS inverter for biasing said first factor, whereby said first feedback circuit introduces hysteresis in the conversion of the trinary level input signals to related binary level output signals in the first CMOS inverter; and
   a second feedback circuit connected to receive the binary level output signals generated by said second CMOS inverter from said third line and connected to said second CMOS inverter for biasing said second factor, whereby said second feedback circuit introduces hysteresis in the conversion of the trinary level input signals to related binary level output signals in the second CMOS inverter.

2. The apparatus recited in claim 1, wherein the first and second factors are approximately 15 without biasing by said first and second feedback circuit.

3. The apparatus recited in claim 1, wherein:
   the feedback circuit associated with said first CMOS inverter includes a third CMOS inverter connected to receive the output signals from said second line and a first shunting transistor connected in parallel with said first inverter's p-channel pull-up field effect transistor, said first shunting transistor having its gate connected to receive the output of said third CMOS inverter, and
   the feedback circuit associated with said second CMOS inverter includes a fourth CMOS inverter connected to receive the output signals from said third line second shunting transistor connected in parallel with said second inverter's p-channel pull-up field effect transistor, said second shunting transistor having its gate connected to receive the output of said fourth CMOS inverter.

4. The apparatus recited in claim 1, further including decode logic for receiving the output signals on the second and third lines and providing three individually responsive output state signals.

5. The apparatus recited in claim 4, further including:
   first delay means connected between said second line and said decode logic to suppress temporary signal transitions on said second line signal; and
   second delay means connected between said third line and said decode logic to suppress temporary signal transitions on said third line signal.

6. An electronic circuit for converting a trinary level input signal on a first line to three binary level output state signals on a second, a third and a fourth line, comprising:
   first converting means connected to receive said trinary level input signal from said first line for converting the trinary level input signal to a first binary level signal, said first binary signal having a first level when said trinary input signal exceeds a first predetermined signal level and a second level otherwise;
   second converting means connected to receive said trinary level input signal from said first line for converting the trinary level input signal to a second binary level signal, said second binary signal having a first level when said trinary input signal exceeds a second predetermined signal level and a second level otherwise;
   first noise suppressing means connected to receive the first binary signal from said first converting means for suppressing temporary signal transitions of said first binary level signal;
   second noise suppressing means connected to receive the second binary signal from said second converting means for suppressing temporary signal transitions of said second binary level signal; and
   decoding logic connected to receive the first and second binary level signals from said first and second filter means for decoding said first and second binary level signals into three binary level output state signals on said second, third and fourth lines.

7. An electronic circuit for converting a trinary level input signal on a first line to three binary level output state signals on a second, a third and a fourth line, comprising:
   first converting means connected to receive said trinary level input signal from said first line for converting the trinary level input signal to a first binary level output state signal, said first output state signal having a first level when the level of said trinary input signal is within a first predetermined signal level range and a second level otherwise;
   means connected between said first converting means and said second line for receiving said first output state signal and suppressing temporary signal transitions of said first output state signal;
   second converting means connected to receive said trinary level input signal from said first line for converting the trinary level input signal to a second binary level output state signal, said second output state signal having a first level when the level of said trinary input signal is within a second predetermined signal level range and a second level otherwise;
   means connected between said second converting means and said third line for receiving said second output state signal and suppressing temporary signal transitions of said second output state signal; and
   means connected to receive said first and second output state signals from said second and third lines for generating a third output state signal therefrom and connected to provide said third output state signal to said fourth line, said third output state signal having a first level when said first and second output state signals are at their second levels and a second level otherwise.

* * * * *

UNITED STATES PATENT AND TRADEMARK OFFICE
CERTIFICATE OF CORRECTION

PATENT NO. : 5,045,728

DATED : September 3, 1991

INVENTOR(S) : Harold S. Crafts

It is certified that error appears in the above-identified patent and that said Letters Patent is hereby corrected as shown below:

Column 5, line 25, after "factor" insert --nominally--.

Column 5, line 56, after "line" insert --and a--.

Signed and Sealed this

Twelfth Day of January, 1993

Attest:

DOUGLAS B. COMER

*Attesting Officer*     Acting Commissioner of Patents and Trademarks